US012666612B2

(12) United States Patent
Pikhay et al.

(10) Patent No.: US 12,666,612 B2
(45) Date of Patent: Jun. 23, 2026

(54) ASYMMETRIC SINGLE-CHANNEL FLOATING GATE MEMRISTOR

(71) Applicant: Tower Semiconductor Ltd., Migdal Haemek (IL)

(72) Inventors: Evgeny Pikhay, Afula (IL); Michael Yampolsky, Migdal Haemek (IL); Yakov Roizin, Afula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 833 days.

(21) Appl. No.: 17/818,166

(22) Filed: Aug. 8, 2022

(65) Prior Publication Data

US 2024/0049462 A1     Feb. 8, 2024

(51) Int. Cl.
H10B 41/30          (2023.01)
H10B 41/60          (2023.01)
(Continued)

(52) U.S. Cl.
CPC ............. H10B 41/30 (2023.02); H10B 41/60 (2023.02); H10D 30/0411 (2025.01); H10D 30/685 (2025.01)

(58) Field of Classification Search
CPC ........ H10B 41/30; H10B 41/60; H10B 41/00; H10B 20/383; H10D 30/6891–6894; H10D 30/0411; H10D 30/685
See application file for complete search history.

(56) References Cited

U.S. PATENT DOCUMENTS 5,825,063  A     10/1998  Diorio et al.
6,862,216  B1     3/2005  Hopper et al.
(Continued)

FOREIGN PATENT DOCUMENTS

WO          2013178730 A1    12/2013

OTHER PUBLICATIONS

Durfee, David A, et al, article entitled "Comparison of floating gate neural network memory cells in standard VLSI CMOS technology", IEEE Transactions on Neural Networks, vol. 3, No. 3, May 1992; pp. 347-353 (7 pages).

(Continued)

*Primary Examiner* — Wael M Fahmy
*Assistant Examiner* — Thomas Wilson McCoy
(74) *Attorney, Agent, or Firm* — Bever, Hoffman & Harms, LLP

(57)          ABSTRACT

A single-channel, single-poly floating gate (EEPROM-type) memristor including asymmetric source/drain-to-gate coupling and an asymmetric channel doping pattern. Asymmetric source/drain-to-gate coupling is achieved by configuring the drain, source and floating gate such that the gate-to-drain capacitance is greater than the gate-to-source capacitance. The asymmetric channel doping pattern is implemented by forming different drain-side and source-side doping portions (i.e., different N-type or P-type implant configurations and/ or positions). The asymmetric channel doping pattern is preferably formed using standard CMOS implants (e.g., NLDD and P-type pocket implants). Multiple N-type and P-type implants may be selectively positioned to achieve a desired balance between program/erase speeds, reverse (read direction) threshold voltage and immunity to read-disturb and over-erase. A drain-side diode may be additionally used to suppress over-erase. A memory circuit including multiple two-terminal memristors disposed in a cross-point array is disclosed, which can be utilized, e.g., in a neuromorphic circuit.

19 Claims, 8 Drawing Sheets

(51) Int. Cl.
    *H10D 30/01*        (2025.01)
    *H10D 30/68*        (2025.01)

(56)          References Cited

U.S. PATENT DOCUMENTS

| | | | |
|---|---|---|---|
| 7,754,564 B2 | 7/2010 | Fenigstein et al. | |
| 7,800,156 B2 | 9/2010 | Roizin et al. | |
| 7,859,043 B2 | 12/2010 | Pikhay et al. | |
| 7,948,020 B2 | 5/2011 | Roizin et al. | |
| 8,344,440 B2 | 1/2013 | Pikhay et al. | |
| 8,344,468 B2 | 1/2013 | Roizin et al. | |
| 8,450,711 B2 | 5/2013 | Williams et al. | |
| 8,455,852 B2 | 6/2013 | Quitoriano et al. | |
| 8,737,113 B2 | 5/2014 | Yang et al. | |
| 8,891,284 B2 | 11/2014 | Williams et al. | |
| 8,999,785 B2 | 4/2015 | Edrei et al. | |
| 9,009,411 B2 | 4/2015 | Moyer et al. | |
| 9,082,867 B2 | 7/2015 | Roizin et al. | |
| 9,514,818 B1 * | 12/2016 | Roizin | H10D 64/661 |
| 10,860,918 B2 * | 12/2020 | Tran | G11C 16/0425 |
| 2008/0303077 A1 * | 12/2008 | Kuo | H10B 69/00 257/314 |
| 2013/0107630 A1 * | 5/2013 | Fisch | H10D 30/681 257/E29.345 |
| 2014/0246719 A1 * | 9/2014 | Dhaoui | G11C 16/3418 257/336 |

OTHER PUBLICATIONS

Diorio, Chris et al., article entitled "A Single-Transistor Silicon Synapse", IEEE Transactions on Electron Devices, vol. 43, No. 11, Nov. 1996, pp. 1972-1980 (9 pages).

Danial, Loai et al., article entitled "Two-terminal floating-gate transistors with a low-power memristive operation . . . ", Nature Electronics, published Dec. 9, 2019, 10 pages.

* cited by examiner

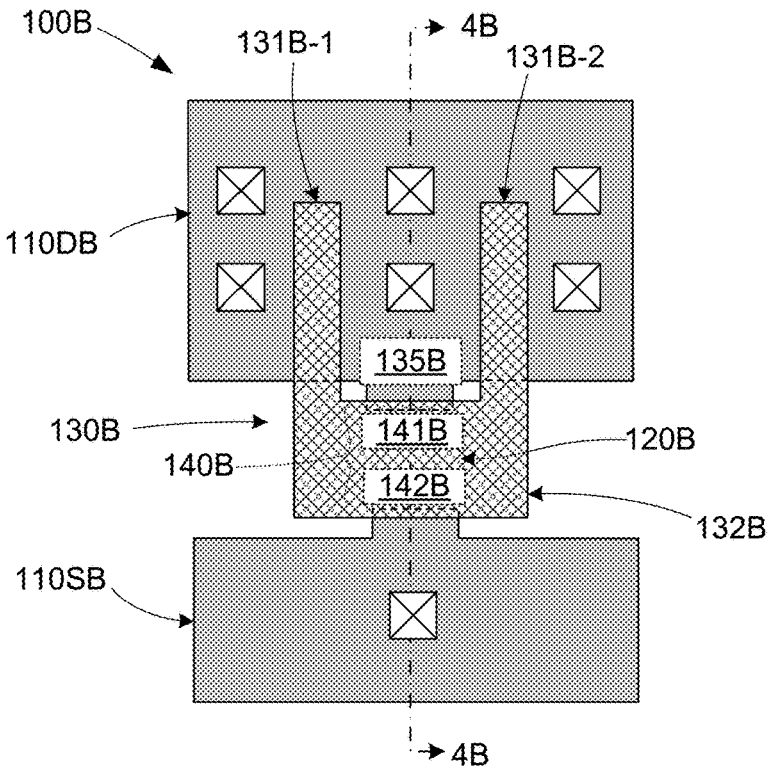
FIG. 4A
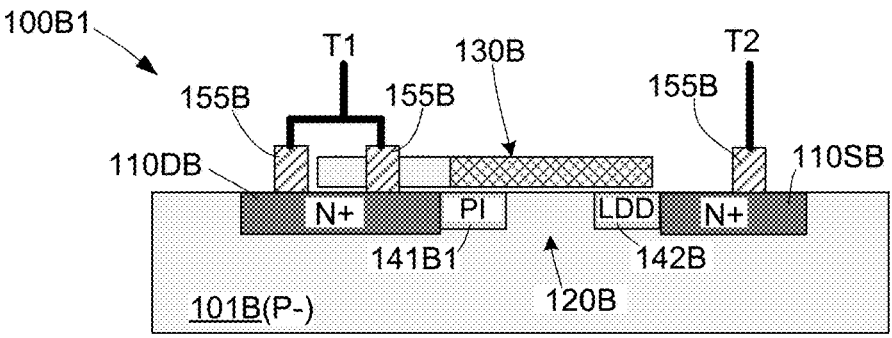
FIG. 4B1
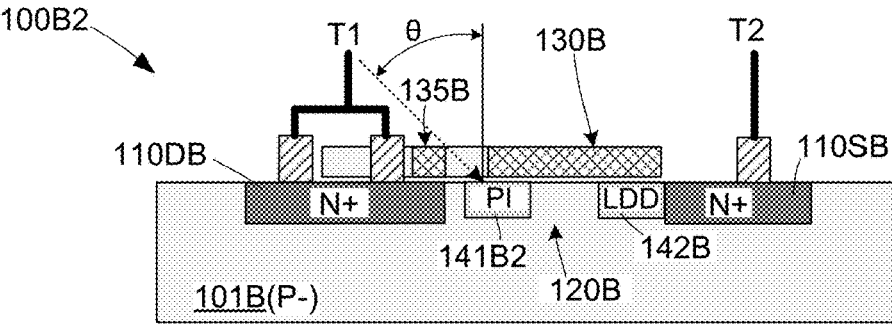
FIG. 4B2

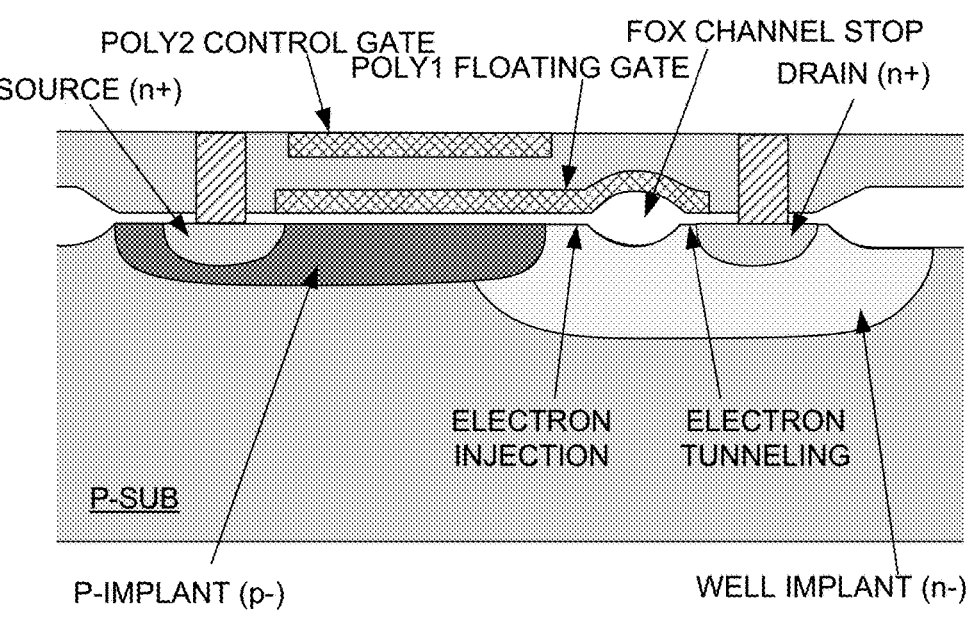
POLY2 CONTROL GATE
POLY1 FLOATING GATE
FOX CHANNEL STOP
SOURCE (n+)
DRAIN (n+)
ELECTRON INJECTION
ELECTRON TUNNELING
P-SUB
P-IMPLANT (p-)
WELL IMPLANT (n-)
FIG. 10 (PRIOR ART)
FIG. 11 (PRIOR ART)
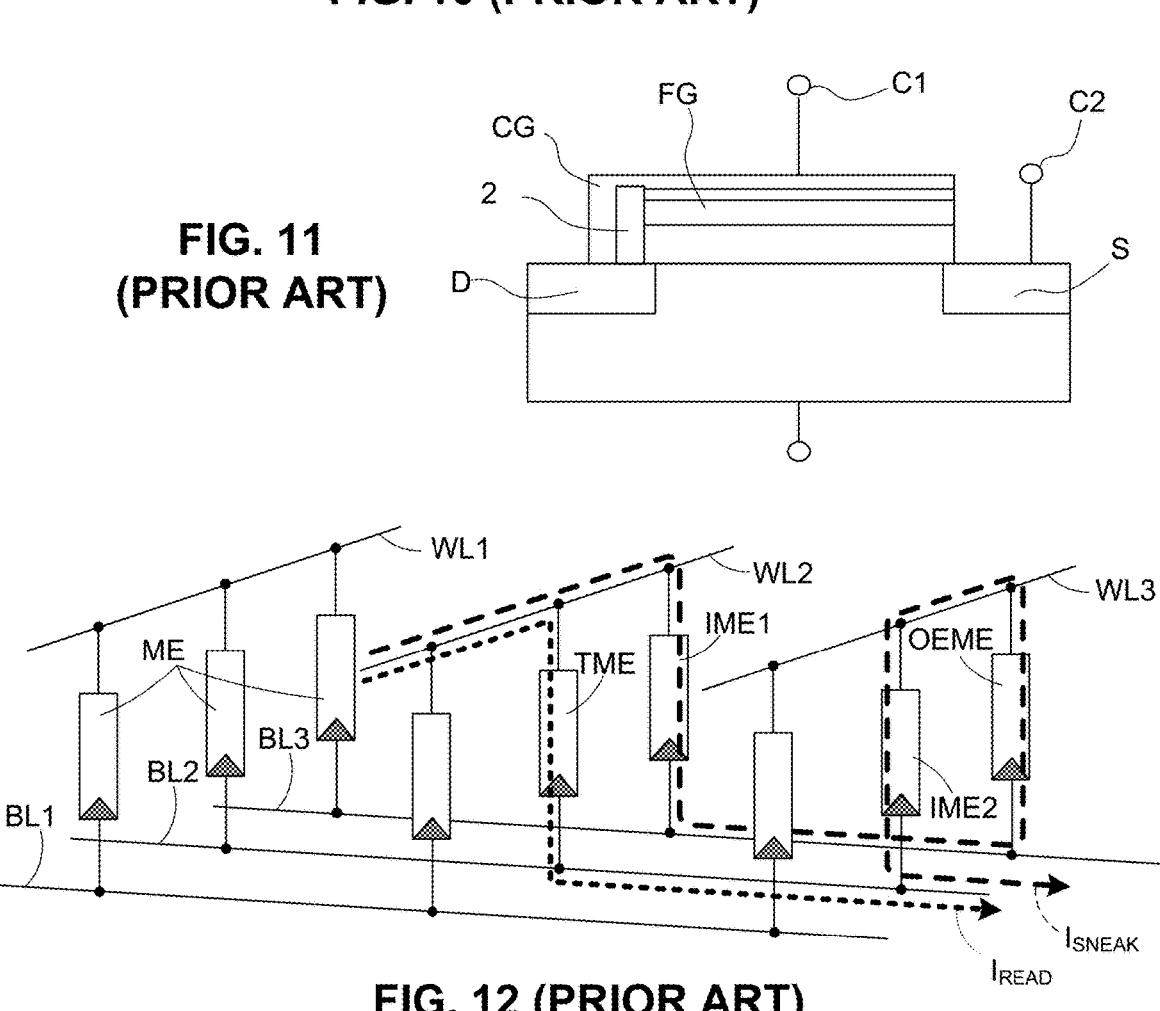
FIG. 12 (PRIOR ART)

ASYMMETRIC SINGLE-CHANNEL FLOATING GATE MEMRISTOR

FIELD OF THE INVENTION

This invention relates to memristors, and more particularly to two-terminal floating gate-type memristors that utilize low-voltage readout operations and can be fabricated using low-cost single-poly CMOS fabrication flows.

BACKGROUND OF THE INVENTION

A memristor is a two-terminal non-volatile electrical memory device whose read resistance is a function of its stored (programmed) charge. Like standard reprogrammable non-volatile memory cells (e.g., electrically erasable programmable read-only memory (EEPROM) cells), memristors implement reprogrammable memory write operations by programming (e.g., charging or discharging) a floating gate, and implement memory read operations using a read current to determine the floating gate's programmed (charged/discharged) state. Memristors differ from EEPROM (and other standard reprogrammable non-volatile memory) cells in that memristors utilize only two terminals to implement reprogrammable memory (read and write) operations, whereas EEPROM cells require three (i.e., source, drain and control/select) terminals to implement reprogrammable memory operations. In contrast, memristors are required to perform both program/erase operations and readout operations using only two terminals. Typically, a memristor's electrical resistance is caused to increase by passing a current through the memristor in one direction and caused to decrease by passing the current in the opposite direction. Once the memristor's resistance state is set in this manner, the stored data (i.e., the increased or decreased resistance state) remains non-volatilely fixed (stored) until it is overwritten (changed) by a subsequently applied current. Also, similar to an EEPROM, the stored data bit can be determined during a readout operation by applying a read voltage across the memristor and measuring a read current passed through the memristor, where the amount of read current passing through the memristor is determined by the programmed resistance state. According to Leon Chua, the inventor of memristors, all two-terminal non-volatile memory devices based on resistance switching are memristors, regardless of the device material and physical operating mechanisms.

In the early synapses-related modeling, attempts were made to emulate memristor-type performance using floating gate technology, where EEPROM-type memory devices (cells) were connected in cross-point arrays to implement neuro-inspired circuits that model learning processes in biological systems. As used herein, the phrase "floating gate technology" refers to integrated circuit fabrication techniques utilized, for example, to produce EEPROMs and other floating gate MOSFET (FGMOS) field-effect transistors. Such floating gate transistors are similar to conventional MOSFETs but drain-to-source currents are controlled by a gate structure made up of an electrically isolated (i.e., completely surrounded by oxide or other highly resistive material) block of doped polycrystalline silicon (polysilicon, or simply "poly") capable of storing an applied charge for long periods of time. Floating gate technology employs the various programming/erase mechanisms (e.g., Fowler-Nordheim tunneling and hot carrier injection) and associated circuit features to adjust (i.e., program or erase) the charge stored on floating gates.

Most attempts to implement synapses-related modeling based on floating gate technology utilize three-terminal EEPROM-type devices. Note that, although these floating gate devices were able to simulate memristor behavior and were therefore sometimes referred to as "memristors", they are technically not memristors due to their three (not two) terminals. Moreover, attempts to utilize three-terminal floating gate devices were deemed overly complicated due to the need to control the third terminal (i.e., the control gate in non-volatile memory (NVM) terminology), which made the synapses-related modeling circuit schematically difficult and costly. Such three-terminal devices were used by Bernard Widrow and Ted Hoffin in the first neuromorphic simulators named Adaline and Madaline. Examples of such devices can be found in IEEE Transactions on Neural Networks, 1992; 3(3), pp. 347-53, "Comparison of floating gate neural network memory cells in standard VLSI CMOS technology" by Durfee D. A, et al.

Some three-terminal EEPROM-type devices utilized in neural networks were fabricated using double-poly CMOS processes. FIG. 10 depicts a representative device of this type, and is similar to that disclosed in "A Single-Transistor Silicon Synapse", Chris Diorio et al., (IEEE Transactions ED, vol. 43, No. 11, 1996). The disclosed device includes source and drain terminals, a third (control gate) terminal implemented using a second polysilicon (POLY2) structure disposed over the floating gate, which is implemented using a first polysilicon (POLY1) structure. These devices are programmed by channel hot electrons and erased by Fowler-Nordheim tunneling at the locations indicated in FIG. 10. The authors of the above-mentioned paper disclosed a two-dimensional synaptic array in which each three-terminal EEPROM-type device of FIG. 10 formed one synapse of the array. In addition to the devices not being memristors (i.e., because they have three terminals), and in addition to their fabrication using a complicated double-poly fabrication technology, the three-terminal EEPROM-type device of FIG. 10 encountered array limitations in that row synapses shared a common drain line, so tunneling at one synapse caused undesired tunneling and hot carrier injection at other row synapses.

FIG. 11 shows an exemplary two-terminal EEPROM-type floating gate cell similar to those disclosed, for example, in "EEPROM MEMORY CELL AS A MEMRISTIVE COMPONENT" by Herman Kohlstedt et al., (Universität Zu Kiel); International Application No. WO2013178730 (also published as German Application No. DE102012209336). The disclosed two-terminal device utilizes a floating gate FG, and is configured as a memristor by way of connecting a control gate CG to the drain terminal D. The floating gate FG allows the respective channel resistance value taken last to be preserved even when no more external voltage is applied at the terminal connections C1 and C2.

FIG. 12 is a simplified diagram depicting two-terminal memristor elements disposed in a cross-point array configuration similar to that utilized in two-dimensional synaptic arrays for synapses-related modeling. The two-terminal memristor elements ME (indicated by rectangles) have drain terminals respectively connected to an associated bit (row) lines BL1 to BL3, and source terminals respectively connected to an associated word (column) lines WL1 to WL3.

Based on practical experience, the present inventors understand that cross-point arrays generated using conventional two-terminal EEPROM-type devices (e.g., see FIG. 11) encounter over-erase problems during erase operations and require the use of high-voltage readout operations, where both of these problems lead to read disturb issues that prevent reliable synapses-related modeling.

Referring to FIG. 12, over-erase is caused by way directly connecting the drain terminals of the memristor elements ME to associated shared bit lines BL1 to BL3 during erase operations, and results in a reduction of the Vt of the over-erased memristor element below 0.5V. During a typical programming operation, the drain electrode/terminal of a target element (e.g., element TME) is directly connected to a high programming voltage source by way of its associated bit line (e.g., bit line BL2), and during erase operations the element's source terminal is connected to a high voltage by way of its associated word line (e.g., a high voltage on word line WL2 is applied to the source terminal of target element TME). Unless the drain terminal of target element TME is isolated during the erase operation, an uncontrollable erase mode may occur that can result in an over-erase condition, which can lead to degradation or even complete failure of the device. That is, the uncontrollable erase mode occurs when the element's floating gate reaches a fully erased state during an erase operation, and channel electrons flowing from the drain generate secondary holes that enter the floating gate, producing an undesirable further reduction of the stored charge that produces a threshold voltage below desirable levels (e.g., below 0.5V). This uncontrollable erase mode cannot be prevented unless the drain electrode is disconnected or otherwise isolated during the erase operation. However, because the drain terminal is directly connected to an associated bit line in order to facilitate programming operations, and because a third terminal is not available to selectively isolate the drain terminal during erase operations, memristor elements ME are subject to over-erase. The present inventors encountered this over-erase problem when experimenting with EEPROM configurations similar to those of FIG. 11 (e.g., those disclosed in co-owned U.S. Pat. No. 7,800,156), and determined that over-erase caused the memory device's threshold voltage to be decreased below 0.5V.

High-voltage readout operations, typically of the order of 2V to 3V, are required by conventional two-terminal EEPROM-type devices (e.g., see FIG. 11) because there is no separate control gate (as in EEPROM memories) to avoid over-erase, so both program/erase and readout operations must be performed through the same two-terminal transistor structure. Because the transistor structure must be sufficiently robust to exclude sneak (leakage) currents in the array, the transistor structure's threshold voltage (e.g., when erased) is also relatively high (e.g., 1.5V to 2.5V), thereby requiring readout voltages in the range of 2V to 3V. These high readout voltages are generated across a target element (e.g., central memristor element THE in FIG. 12) by way of applying two signals (e.g., 3V and 0V) respectively to associated bit line BL2 and associated word line WL2, whereby a charge stored on target memristor element TME can be determined by measuring a resulting read current $I_{READ}$ generated on associated word line WL2. However, the low Vt can lead to sneak currents through other memristor elements, such memristor element OEME in FIG. 12, that can prevent accurate readout of a target memristor element. For example, as indicated in FIG. 12, during readout of target memristor TME, if neighboring memristor element OEME is over-erased, a sneak current $I_{SNEAK}$ can be generated through over-erased element OEME by way of (intermediate) elements IME1 and IME2 such that sneak current $I_{SNEAK}$ flows on bit line BL2, thereby preventing accurate readout of the programmed/erased state of target element TME by corrupting read current $I_{READ}$.

U.S. Pat. No. 9,514,818 discloses a dual-channel Y-Flash memristor including two asymmetric transistors (i.e., a readout transistor and an injection (program/erase) transistor) that are connected in parallel (i.e., both share a drain region and have connected source regions and share a floating gate structure). The Y-Flash memristor also utilizes a diode connected to the shared drain region to address the over-erase issue described above. Although the dual-channel Y-Flash memristor the two-transistor configuration results in a relatively large memristor footprint and relatively high-power consumption due to channel leakage in the injection transistor during readout, and channel leakage in the readout transistor during program/erase operations. Although the dual-channel Y-Flash memristor has been implemented in many neuromorphic devices (discussed below), there is ongoing demand for memristors having ever-decreasing footprints and power consumptions to enable next generation neuromorphic devices. Neuromorphic engineering, also known as neuromorphic computing, is a concept developed by Carver Mead in the late 1980s and involves the use of very-large-scale integration (VLSI) systems containing electronic analog circuits to mimic neuro-biological architectures present in the nervous system. In recent times the term neuromorphic has been used to describe analog, digital, and mixed-mode analog/digital VLSI circuits and software systems that implement models of neural systems (for perception, motor control, or multisensory integration). The implementation of neuromorphic computing has been implemented on the hardware level by neuromorphic circuits. A key aspect of neuromorphic engineering is understanding how the morphology of individual neurons, circuits, applications, and overall architectures creates desirable computations, affects how information is represented, influences robustness to damage, incorporates learning and development, adapts to local change (plasticity), and facilitates evolutionary change. Neuromorphic engineering is an interdisciplinary subject that takes inspiration from biology, physics, mathematics, computer science and electronic engineering to design artificial neural systems, such as vision systems, head-eye systems, auditory processors, and autonomous robots, whose physical architecture and design principles are based on those of biological nervous systems.

To date, most VLSI circuits developed for neuromorphic systems relied on floating gate memristors or arrays of three-terminal memristor-emulating cells, such as those described above, and were therefore subject to the limitations mentioned above. More recently, various new types of memristors have been introduced, including Phase-Change Memory (PCM), and Resistive Random-Access Memory (RRAM or ReRAM), all of which being referred to as memristive elements or memristors. Though allowing small cell footprints, these memristor technologies are still not fully mature. In particular, the arrays of interconnected resistive memory two-terminal devices require special additional rectifying elements in each of the memristor cells. Otherwise, such arrays exhibit sneak currents (i.e., stray currents due to leakage). Memory arrays using ReRAM memristors also have reliability (endurance and retention) limitations.

What is needed is a two-terminal, floating gate (EEPROM-type) memristor suitable for neuromorphic simulations and other bio-inspired modeling systems that utilizes the benefits of floating gate technology while overcoming the above-mentioned problems associated with implementing conventional memristor devices in cross-point array configurations. What is particularly needed is memristor having a smaller footprint and lower power consumption in comparison to conventional memristors, while still being capable of implementing reliable floating gate program/ erase operations. What is preferably needed is a solution achieving the above that can also be implemented using low-cost standard single-poly semiconductor fabrication (e.g., CMOS) technology.

SUMMARY OF THE INVENTION

The present invention is directed to a single-channel floating gate (EEPROM-type) memristor that utilizes asymmetric source/drain-to-gate coupling and an asymmetric channel doping pattern to achieve a smaller memristor footprint and lower power consumption (i.e., in comparison to conventional memristors having two or more channels). The asymmetric source/drain-to-gate coupling is achieved by configuring the drain region, source region and polycrystalline silicon floating gate structure such that a gate-to-drain capacitance between the floating gate structure and the drain region is greater than a gate-to-source capacitance generated between the floating gate structure and the source region. The asymmetric channel doping pattern is implemented by providing one or more N-type or P-type implants in the channel formed between the drain region and the source region in an asymmetrical (offset) arrangement. By including both asymmetric source/drain-to-gate coupling and asymmetric channel doping, the memristor generates different lateral fields at opposite ends of the channel, thereby facilitating fine-tuning of the two-terminal resistance (both increase and decrease) to a desired set resistance value, as well as facilitating read operations using a single channel without disturbing the set resistance. By enabling these two-terminal operations using a single channel floating gate structure, the present invention also facilitates producing memristors having a smaller footprint and exhibiting lower power consumption than conventional memristors requiring two or more channels.

According to a first aspect, the asymmetric channel doping pattern includes one or more implants (i.e., a region of P-type dopant and/or a region of N-type dopant) that is/are asymmetrically disposed in the channel region. For descriptive purposes, the channel region is divided into two portions: a drain-side channel region extending between the drain region and a channel midpoint (i.e., a point halfway between the drain region and the source region), and a source-side channel region extending between the source region and the channel midpoint. Also, for descriptive purposes, the asymmetric channel doping pattern is divided into a drain-side implant portion and a source-side implant portion, where the drain-side implant portion occupies the drain-side channel region, and the source-side implant portion occupies the source-side channel region. The drain-side implant portion comprises zero or more N-type dopants and zero or more P-type dopants (i.e., when both zero N-type dopants and zero P-type dopants are present, the drain-side implant portion retains the light doping concentration of the substrate). Similarly, the source-side implant portion comprises zero or more N-type dopants and zero or more P-type dopants. According to the first aspect, (i) the drain-side implant portion and the source-side implant portion collectively include at least one P-type implant or N-type implant that is/are asymmetrically disposed in the channel region, and (ii) the implants forming the drain-side implant portion differ in dopant type or implant location from an inverted version of the implants forming the source-side implant portion, where the "inverted version" is formed by mirroring the source-side implant portion about the channel midpoint.

As set forth in the various embodiments set forth below, by altering the number, type and positioning of the N-type and/or P-type implant(s) forming the asymmetric channel doping pattern, the present invention facilitates "fine tuning" the resulting memristor's operating characteristics to enhance certain operating characteristics that are important to a given memristor application.

In some embodiments the asymmetric channel doping pattern is implemented by a single P-type implant adjacent to the drain region and/or at least one N-type implant adjacent to the source region to enhance programming speed and to facilitate readout at lower voltages, thus reducing power consumption (for the same readout current). Note that a single (P-type or N-type) implant forms an asymmetrical channel doping pattern if entirely formed in either the drain-side channel region or the source-side channel region; in contrast, the single implant but would form a symmetrical (not asymmetrical) channel doping pattern if centered within the channel (i.e., the implant's midpoint coincided with the channel's midpoint). Providing a P-type implant immediately adjacent to the drain region increases the adjacent drain-side lateral field (i.e., in comparison to an N-type implant or the absence of a P-type pocket implant), which functions to both increase program operation speeds and reduce power consumption during programming, but also increases the read disturb (parasitic programming) during read operations. Shifting this P-type drain-side implant toward the middle of the channel decreases the read disturb effect, but also decreases the programming efficiency. Providing an N-type implant immediately adjacent to the source region decreases the adjacent source-side lateral field (e.g., in comparison to a P-type pocket implant), thereby beneficially decreasing the memristor's forward threshold voltage, but also decreasing erase operation speeds. Accordingly, operating characteristics of a given single-channel memristor are effectively "tunable" by way of altering the presence/ absence and location of P-type and N-type implants utilized to form the memristor's asymmetric channel doping pattern.

In alternative embodiments, the one or more implants forming the asymmetric channel doping pattern are generated using either a standard CMOS implant or a non standard CMOS implant. In one embodiment, the asymmetric channel doping pattern is implemented by a standard CMOS P-type pocket implant that abuts the drain region and extends into the channel region. In another embodiment, the asymmetric channel doping pattern is implemented by a standard CMOS N-type lightly-doped drain (NLDD) implant that abuts the source region and extends into the channel region. By implementing the asymmetric channel doping pattern using standard CMOS implants, the present invention facilitates low-cost and reliable production of single-channel memristors. In alternative embodiments, the asymmetric channel doping pattern may be implemented using one or more custom implants (i.e., N-type and/or P-type implants that are not included in a standard CMOS flow), where the increased cost of implementing the custom implant(s) into a CMOS fabrication flow may be offset by improved memristor performance provided by the non-standard location and/or doping level of the custom implants.

According to an aspect, the floating gate structure forms the only polycrystalline silicon structure of the single-channel memristor, thereby further facilitating economical production of single-channel memristors by facilitating the use of low-cost single-poly fabrication process flows. According to a practical embodiment, the asymmetric source/drain-to-gate coupling is achieved by implementing the floating gate as a c-shaped polycrystalline silicon structure including two arms extending in parallel from a base. The floating gate is disposed such that portions of the two arms extend over relatively large portions of the drain region to produce the required relatively high gate-to-drain capacitance, and a portion of the base overlaps a relatively small portion of the source region to produce the required relatively low gate-to-source capacitance. In one embodiment the floating gate is formed such that a ratio of the gate-to-drain capacitance to the gate-to-source capacitance is in the range of 5-to-1 to 50-to-1.

In some embodiments the asymmetric channel doping pattern of each memristor utilizes at least one N-type implant and at least one P-type implant to generate a desired combination of memristor operating characteristics. In one exemplary embodiment a memristor includes a drain-side P-type implant that extends into the channel from the N+ drain region and a source-side N-type implant that extends into the channel from the N+ source region, whereby the resulting memristor 100B exhibits low read voltages and fast programing speeds, but slow erase speeds and a moderate risk of over-erase and read-disturb. In other embodiments, over-erase may be suppressed by forming an N-type implant between the N+ drain region and a P-type implant, where both the N-type and P-type implants are at least partially disposed in the drain-side region, and where the source-side region is either undoped to achieve higher erase speeds or includes an N-type implant to further resist over-erase. When the source-side implant is omitted, the P-type implant may be symmetrically located in the channel, whereby the single drain-side N-type implant produces the required asymmetry of the asymmetric channel doping pattern. When the source-side implant is included, it may be necessary to asymmetrically position the P-type implant in the channel to produce the required asymmetry of the asymmetric channel doping pattern. By providing the single-channel memristors of the present invention with an asymmetric channel doping pattern formed by one or more selectively positioned P-type and/or N-type channel implants in this manner, the present invention facilitates the production of neuromorphic circuits having a wide range of operating characteristics. In other embodiments it may be desirable to utilize an asymmetric channel doping pattern that provides high erase speeds at the expense of increased risk of read disturb (i.e., by forming a drain-side N-type implant and a source-side P-type implant).

In some embodiments it may be beneficial to modify the memristor to include a diode to function both as a current limiter that prevents over-erase during the high-voltage erase operations, and also to prevent sneak (leakage) currents during low-voltage readout operations. In some embodiments, bulk silicon CMOS processes are utilized to produce memristors having diodes that are at least partially formed in N-well regions abutting an N+-doped drain region of the memristor. In alternative exemplary embodiments, the diode is implemented either as a Schottky diode or as a vertical p-n junction diodes, depending on desired fabrication cost and performance considerations. In alternative Schottky diode embodiments, the diode is formed either by a silicide structure or a metal contact structure or disposed in direct contact with the upper substrate surface over the N-well region. In an exemplary p-n junction diode embodiment, the diode's anode is implemented by a P+ diffusion region formed in the N-well region (cathode) using established (standard) N− and P+ implants provided in the single-poly CMOS fabrication flow to minimize fabrication costs but may be implemented by non-standard (special) implants to enhance diode performance. In other embodiments in which the memristors are fabricated on an SOI substrate, the optional diodes may be implemented as lateral diodes. Although the addition of a diode increases the memristor footprint (i.e., over single-channel memristor embodiments that omit a diode), the diode facilitates the use of asymmetric channel doping patterns that provide faster erase speeds by preventing both sneak currents during the low-voltage readout operations and over-erase conditions during the program/erase operations.

The present invention is also directed to a memory circuit including memristors disposed in a cross-point array (i.e., arranged in rows and columns) and to a neuromorphic circuit including the memory circuit, where each memristor is implemented using one of the novel memristor structures discussed above and connected between associated signal lines (e.g., between an associated word line and an associated bit line). As set forth above, the novel memristor configuration facilitates the fabrication of cross-point type arrays using low-cost single-poly CMOS fabrication techniques, providing memory circuits that are suitable for neuromorphic circuits. In addition, the single-poly structure of the novel memristors facilitates the fabrication of cross-point-array-type memory circuits using the same CMOS fabrication flow as that utilized to generate processors and other components of a neuromorphic circuit, thereby minimizing production costs. Further, memristors produced in accordance with the present invention are believed to be highly reproducible and repeatable, to exhibit high retention characteristics, and to require relatively simple circuitry for performing associated program, erase and readout operations, thereby making them ideal for use in neuromorphic and other bio-inspired modeling systems.

BRIEF DESCRIPTION OF THE DRAWINGS

These and other features, aspects and advantages of the present invention will become better understood with regard to the following description, appended claims, and accompanying drawings, where:

FIGS. 4A, and 4B1 and 4B2 are top plan and simplified cross-sectional side view showing a memristor including two channel implants according to an exemplary embodiment;

FIG. 10 is a cross-sectional side view showing a conventional three-terminal EEPROM-type device;

FIG. 11 is cross-sectional side view showing a conventional two-terminal EEPROM-type device; and FIG. 12 is a simplified diagram depicting a plurality of conventional two-terminal devices connected in a cross-point array.

DETAILED DESCRIPTION OF THE DRAWINGS

The present invention relates to an improvement in memristive elements (memristors). The following description is presented to enable one of ordinary skill in the art to make and use the invention as provided in the context of a particular application and its requirements. As used herein, directional terms such as "upper", "lower", "forward" and "reverse" are intended to provide relative positions and directions for purposes of description and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 1:
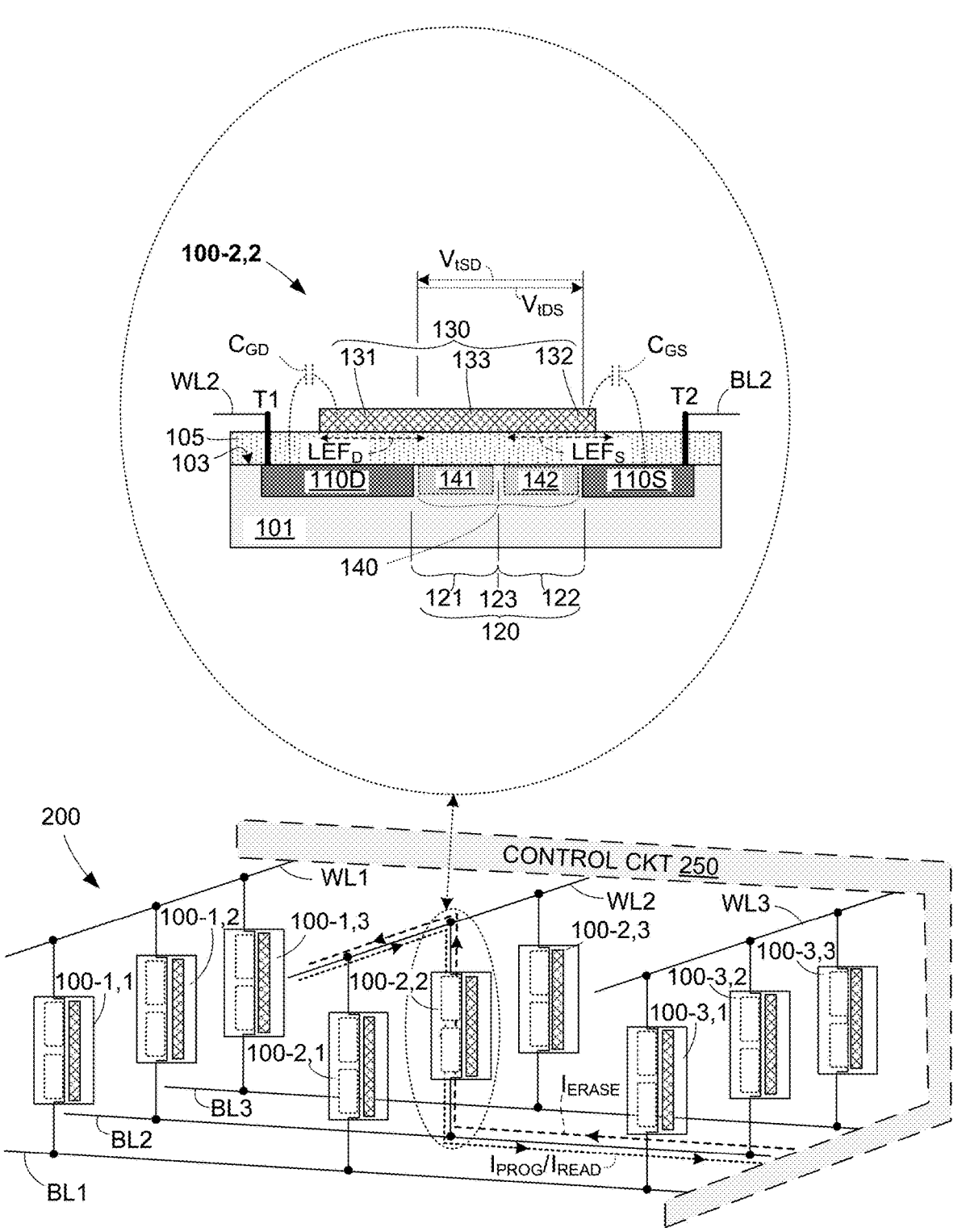
FIG. 1 is a simplified circuit diagram showing a memristor according to a generalized embodiment of the present invention.

FIG. 1 is a simplified diagram showing a cross-point array 200 including nine memristors 100-1,1 to 100-3,3 and a control circuit 250 according to a simplified embodiment of the present invention. Each memristor 100-1,1 to 100-3,3 includes structures identical to those of memristor 100-2,2, which is shown in additional detail in the bubble provided at the upper portion of FIG. 1 and described in additional detail below (i.e., all references to features of memristor 100-2,2 below are understood as being applicable to all other memristors of array 200). Memristors 100-1,1 to 100-3,3 are arranged in row groups connected to associated word lines WL1 to WL3, and column groups connected to associated bit lines BL1 to BL3. For example, memristors 100-1,1 to 100-1,3 form a row group that is connected to word line WL1. Similarly, memristors 100-1,1, 100-2,1 and 100-3,2 form a column group that is connected to bit line BL1. Accordingly, each memristor 100-1,1 to 100-3,3 is individually addressable during program, erase and read operations by applying appropriate potentials to the unique word-line-bit-line combination associated with a targeted memristor. For example, as explained in detail below, memristor 100-2,2 is individually addressable during program, erase and readout operations by way of applying signals to word line WL2 and bit line BL2.

In compliance with the established convention relating to memristors, each memristor 100-1,1 to 100-3,3 is a two-terminal device that is controlled entirely by signals transmitted on bit lines BL1 to BL3 and word lines WL1 to WL3. That is, all program/erase and readout operations of memristors 100-1,1 to 100,3,3 are performed solely by way of suitable potentials generated by a control circuit 250 onto bit lines BL1 to BL3 and word lines WL1 to WL3. For example, referring to the top of FIG. 1, all program/erase and readout operations of memristor 100-2,2 are performed solely by applying voltages by way of word line WL2 and bit line BL2, which are respectively connected to a (first) terminal T1 and a (second) terminal T2 of memristor 100-2,2.

Memristor 100-2,2 generally includes drain region 110D and a source region 110S separated by a channel 120 and a single-piece floating gate 130. Drain region 110D and source region 110S comprise N+ implants formed in a P-type (bulk) semiconductor substrate 101 and are respectively operably coupled to a first terminal T1 and a second terminal T2 using known CMOS fabrication techniques. Channel 120 comprises a region of substrate 101 that extends between drain region 110D and source region 110S. For purposes of describing asymmetric channel doping (discussed below), channel 120 is divided into two channel regions: a drain-side channel region 121 that extends from drain region 110D to a channel midpoint 123, and a source-side channel region 122 that extends from source region 110S to channel midpoint 123. Floating gate 130 is an integral (single-pieced) polycrystalline silicon (polysilicon, or simply "poly") structure that is separated from an upper surface 103 of substrate 101 by a gate oxide layer 105 and is otherwise entirely surrounded by oxide or other highly resistive material (i.e., electrically isolated, or "floating"). Floating gate 130 includes a (first) poly portion 131 disposed over a portion of drain region 110D, a second poly portion 132 disposed over a portion of source region 110S, and an intervening (third) poly portion 133 connected between poly portions 131 and 132.

According to an aspect of the invention, floating gate 130 forms the only polycrystalline silicon structure of memristor 100 (i.e., memristor does not include or utilize a control gate or any other dedicated polysilicon gate structure to perform program, erase and readout operations). This single-gate feature allows memristor 100 to be fabricated using low-cost single poly CMOS fabrication flows, thereby providing a significant cost advantage over conventional approaches formed by double-poly CMOS processes, such as the conventional device described above with reference to FIG. 10.

According to another aspect of the invention, drain region 110D, source region 110S and floating gate 130 are configured and fabricated such that drain-to-gate capacitance $C_{DG}$ is at least five times (e.g., in the range of 5× to 50×) greater than source-to-gate capacitance $C_{SG}$, whereby memristor 100-2,2 exhibits asymmetric source/drain-to-gate coupling. That is, the amount of drain-to-gate coupling of memristor 100-2,2 is determined by drain-to-gate capacitance $C_{DG}$ generated between drain region 110D and floating gate 130, and the amount of source-to-gate coupling of memristor 100-2,2 is determined by source-to-gate capacitance $C_{SG}$ generated between source region 110S and floating gate 130. In conventional transistors, the drain, source and gate are typically configured in a symmetric manner such that the drain-to-gate coupling/capacitance is substantially equal to the source-to-gate coupling/capacitance. In accordance with the present aspect, drain region 110D, source region 110S and floating gate 130 are intentionally fabricated, shaped and cooperatively positioned in an asymmetrical manner that generates a greater (higher) capacitance $C_{DG}$ between drain region 110D and floating gate 130 and a lesser (lower) capacitance $C_{SG}$ between source region 110S and floating gate 130. The required asymmetric source/drain-to-gate coupling may be achieved by way of generating a relatively large drain region 110D and a relatively small source region 110S, and by configuring floating gate 130 such that the amount of poly portion 131 disposed over drain region 110D is larger than the amount of poly portion 132 disposed over source region 110S. An exemplary memristor configuration that achieves asymmetric source-drain coupling in this manner is described below with reference to FIG. 4A. In other embodiments, the required asymmetric coupling can be achieved, for example, by extending the FG poly periphery in the drain region, when fringing capacitance is dominating in drain-to-FG capacitance, and/or by providing a larger number of contacts to the drain region than to the source region, or by providing a special N diffusion that is connected to the drain region and disposed under the FG.

According to another aspect of the invention, 100-2,2 further includes an asymmetric channel doping pattern 140 formed by at least one N-type or P-type implant that is/are asymmetrically disposed in channel 120 between drain region 110D and source region 110S. For descriptive purposes, asymmetric channel doping pattern 140 is depicted as including a drain-side doping portion 141 that is disposed adjacent to drain region 110D (i.e., disposed in drain-side channel region 121 between drain region 110D and channel midpoint 123) and a source-side doping portion 142 disposed adjacent to source region 110S (i.e., in source-side channel portion 122 between source region 110S and channel midpoint 123). Each doping portion 141 and 142 represents either (a) one or more N-type and/or P-type implants, or (b) unprocessed substrate material (i.e., in the absence of N-type/P-type implants, one of doping portion 141 and doping portion 142 would essentially comprise the light P-type doping level of substrate 101). As indicated in FIG. 1, memristor 100 is fabricated on slightly p-doped substrate 101 in a manner similar to that of a bulk native (aka, natural) transistor, thereby providing memristor 100 with a lower threshold voltage than if formed in a well region. In some embodiments, asymmetric channel doping pattern 140 is configured to provide memristor 100 with reverse threshold voltage $V_{tDS}$ in the range of 0 to 0.5V, and with a forward threshold voltage $V_{tSD}$ that is one to two volts (1-2V) higher than reverse threshold voltage $V_{tDS}$. To be an asymmetric channel doping pattern, doping pattern 140 must be formed such that doping portion 141 is not a mirror image of doping portion 142. As set forth below with reference to the exemplary embodiments depicted in FIGS. 3A to 3D, asymmetric channel doping is achieved by forming a single P-type or a single N-type implant disposed in either drain-side channel region 121 or source-side region 122 (i.e., either drain-side doping portion 141 or source-side doping portion 142 is implemented as unprocessed substrate material). As set forth below with reference to the exemplary embodiments depicted in FIGS. 4A, 4B1, 4B2 and 6, asymmetric channel doping is also achieved by forming a P-type implant in drain-side channel region 121 and an N-type implant in source-side channel region 122, or vice versa. Other exemplary asymmetric channel doping patterns including more than two implants are described below. Note that the depicted examples are intended to illustrate various possible asymmetric channel doping patterns, and that other asymmetric channel doping patterns including any number of P-type and/or N-type implants are intended to fall within the spirit and scope of the present invention unless otherwise restricted in the appended claims.

Figure 2A:
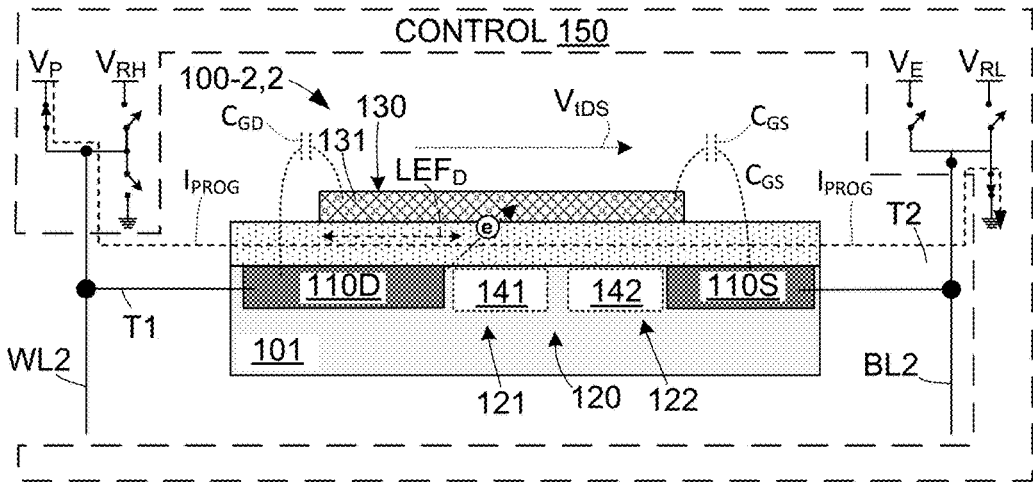
FIGS. 2A, 2B and 2C are simplified circuit diagram showing the memristor of FIG. 1 during exemplary program, erase and readout operations, respectively.
Figure 2B:
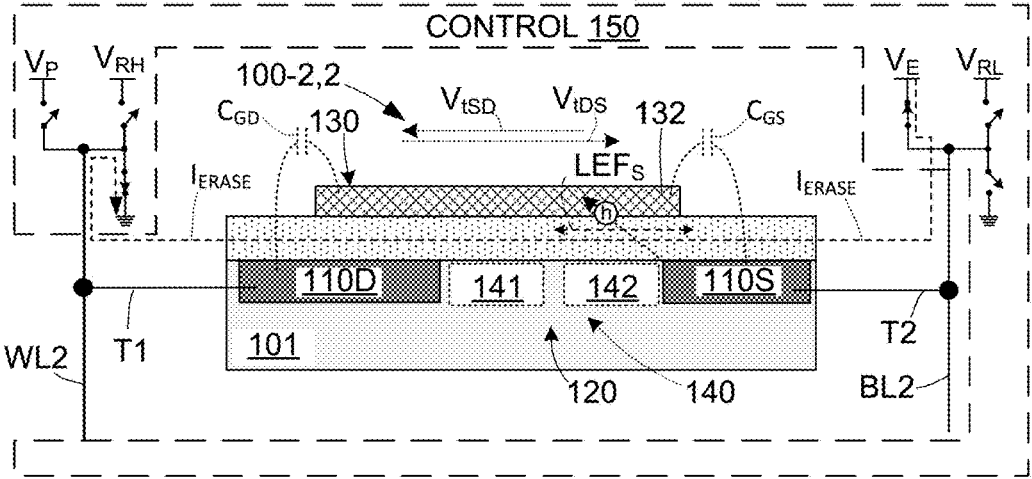
Figure 2C:
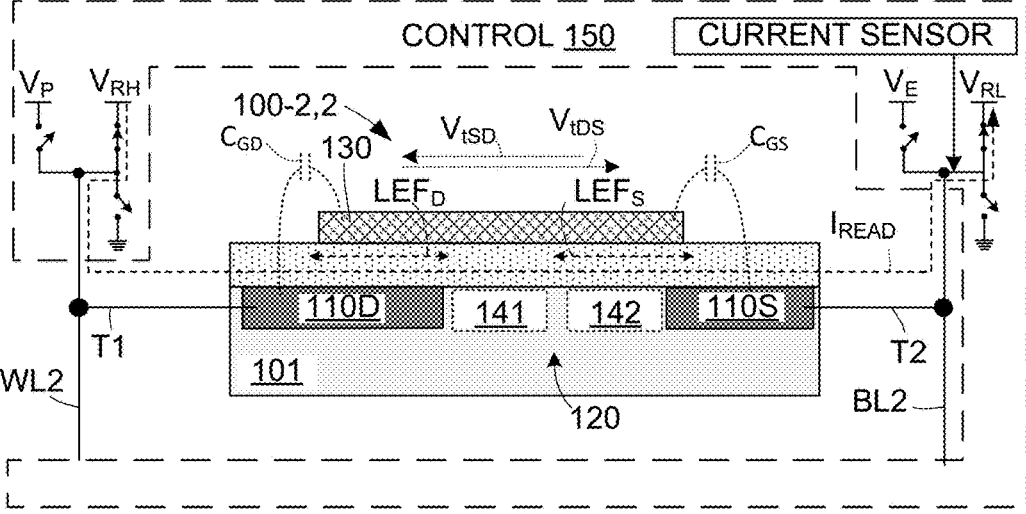

FIGS. 2A to 2C depict memristor 100-2,2 during exemplary program, erase and readout operations, respectively. For illustrative purposes, FIGS. 2A to 2C depict simplified switch connections associated with the operation control circuit 250. Those skilled in the art will recognize that the depicted switch connections can be implemented using various techniques, and that control circuit 250 includes additional circuitry not depicted in the simplified illustrative examples.

Referring to FIG. 2A, control circuit 250 is configured to program memristor 100-2,2 during a program operation by way of coupling a positive program voltage VP (e.g., 5.5 Volts) to terminal T1 (by way of associated word line WL2) and to coupling terminal T2 to ground (by way of associated bit line BL2), thereby generating current IPROG in from drain region 110D to source region 110S through memristor 100. Note that the corresponding flow of negatively charged electrons is opposite to the current flow: i.e., current IPROG causes electrons to flow from source region 110s to drain region 110D. These conditions generate a channel hot electron (CHE) injection mechanism that causes the injection of electrons (indicated by circled e) from channel 120 into floating gate 130, whereby the resulting programmed charge stored on floating gate 130 increases the reverse threshold voltage VtDS of memristor 100-2,2 (e.g., from approximately 1V to approximately 4V). In some embodiments, drain-side doping portion 141 includes a P-type implant that, if placed close enough to drain region 110D, functions to speed up the programming process (i.e., reduce the required program operation time period) by increasing drain-side lateral field LEFD (i.e., the lateral field generated adjacent to drain region 110D). In other embodiments, drain-side doping portion 141 includes an N-type implant that functions to slow down the programming process (i.e., reduce the required program operation time period) by decreasing the drain-side lateral field LEFD. It is necessary to hold the potential of floating gate 130 close to the potential of drain region 110D during programming (and read) operations (i.e., to transfer all drain voltage to floating gate 130). The applied to drain voltage is divided between capacitances CGD and CGS connected in series.

Referring to FIG. 2B, control circuit 250 is further configured to erase a charge from memristor 100-2,2 during an erase operation by way of coupling a positive erase voltage $V_E$ (e.g., 5.5V to 8.5V) to terminal T2 while connecting terminal T1 to ground (0V). Under these conditions, holes (indicated by circled h) generated by band-to-band tunneling and heated in the lateral field are introduced from source region 110S to portion 132 of floating gate 130. As a result, the threshold voltage of memristor 100-2,2 decreases (e.g., from approximately 4V to approximately 0.5 V). In some embodiments, source-side doping portion 142 includes a P-type implant that functions to speed up the erasing process (i.e., reduce the required erase operation time period) by increasing (strengthening) source-side lateral field $LEF_S$ (i.e., in comparison to the lateral field generated in the absence of a P-type implant). In other embodiments, source-side doping portion 142 includes an N-type implant that functions to slow down the erasing process (i.e., increase the required erase operation time period) by decreasing (weakening) lateral field $LEF_S$ (i.e., in comparison to the lateral field generated in the absence of an N-type implant). It is necessary to hold the potential of floating gate 130 close to the potential of source region 110S during erase operations (with drain region 110D floating). During erase operations floating gate 130 is coupled to ground by capacitance $C_{GD}$ and connected in series to it capacitance of wordline WL2. In general, the objective of a given asymmetric channel doping pattern is to minimize over-erase that results from electrons flowing from drain region 110D to source region 110S during erase operations. These electrons can become heated in the source-side lateral field and can cause an avalanche that generates secondary holes, which are accelerated in the source-side lateral field $LEF_S$ and injected into floating gate 130 (like BBT holes). This over-erase process generates a positive feedback and is therefore very dangerous. Decreasing the flow of electrons from drain region 110D (e.g., by forming a source-side NLDD implant) decreases the lateral field that results in avalanche, but at the expense of longer erase times. Such drain engineering benefits memristors where program and erase operations are utilized to "tune" the forward threshold voltage, which differs from NVM devices where erasing to minimum values is important.

Referring to FIG. 2C, control circuit 250 is further configured to read out a charge stored on memristor 100-2,2 during a read operation by way of applying a higher (first) readout voltage $V_{RH}$ to terminal T1 and a lower (second) readout voltage $V_{RL}$ to terminal T2, and then measuring the resulting read current $I_{READ}$ passed through memristor 100-2,2 onto bit line BL2. In an exemplary embodiment in which high read voltage $V_{RH}$ is 1V and lower read voltage $V_{RL}$ is 0V, a read current $I_{READ}$ through memristor 100-2,2 is, for example, less than 1 μA when floating gate 130 is in a programmed state, and greater than 10 μA when floating gate 130 is in an erased state. Note that the single-channel memristor configuration of memristor 100-2,2 achieves lower power consumption during read operations than conventional two-transistor memristor configurations by eliminating leakage currents through the separate injection transistor channel required by the two-transistor memristor. Moreover, in some embodiments, one or both of drain-side doping portion 141 and source-side doping portion 142 include implants that (individually or collectively) function to reduce the reverse threshold voltage $V_{tDS}$, thereby further reducing power consumption during read operations. In some embodiments, the desired lower reverse threshold voltage $V_{tDS}$ is achieved by forming source-side doping portion 142 including an N-type LDD implant. This implant is also causing memristors 100-1,1 to 100-3,3 to further suppress over-erase by decreasing the probability of creating secondary holes in the channel (i.e., to suppress avalanche effects stimulated by electrons injected into floating gate 130 from drain region 110D), also protecting against sneak currents described above with reference to FIG. 12.

Various embodiments will now be described to illustrate various exemplary asymmetric channel doping patterns. The various exemplary embodiments are depicted as single-poly CMOS (bulk silicon) circuit elements to illustrate how single-channel memristors of the present invention may be fabricated using low-cost fabrication flows. FIGS. 3A to 3D depict embodiments in which each exemplary memristor has an asymmetric channel doping pattern including a single N-type or P-type implant (i.e., either a source-side implant or a drain-side implant). FIGS. 4A, 4B1, 4B2, 5A, 5B and 6 depict alternative embodiments in which each exemplary memristor has an asymmetric channel doping pattern including two or more N-type or P-type implants. These exemplary embodiments are intended to illustrate how different asymmetric channel doping patterns may be utilized to achieve various neuromorphic circuit operating characteristics (e.g., fast program operations, fast erase operations, low forward threshold voltage, etc.), and that the exemplary embodiments are not intended to limit the possible asymmetric channel doping pattern configurations that may be employed. Moreover, although the invention is depicted using bulk silicon circuit structures, it is understood that the various features and aspects described herein may be implemented using CMOS SOI fabrication techniques.

Figure 3A:
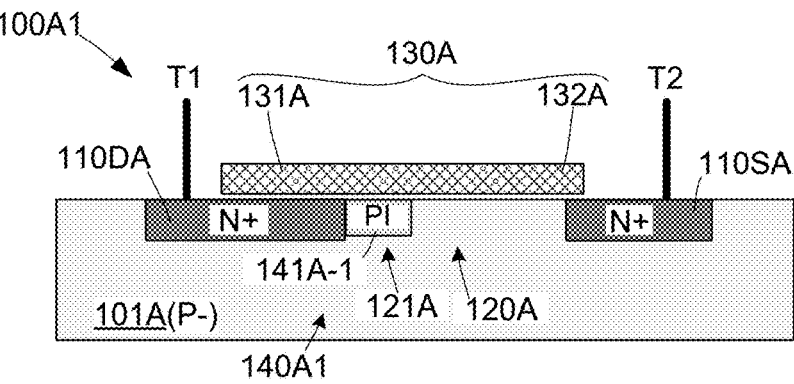
FIGS. 3A, 3B, 3C and 3D are simplified cross-sectional side views showing memristors including a single channel implant according to exemplary embodiments.
Figure 3B:
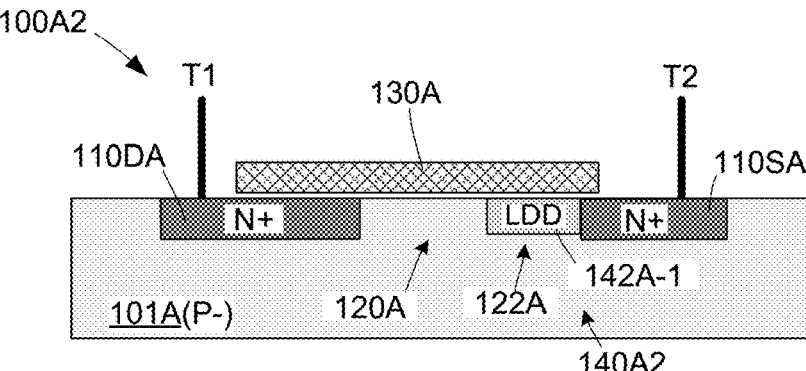
Figure 3C:
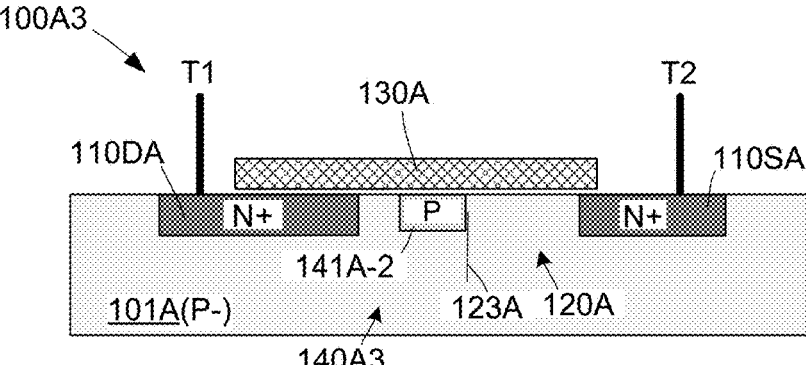
Figure 3D:
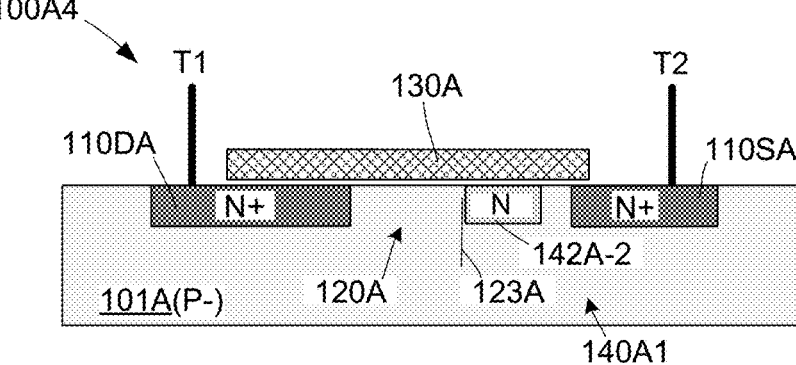

FIGS. 3A and 3D respectively depict single-channel memristors 100A1 to 100A4 that are generally configured in the manner described above with reference to memristor 100 (FIG. 1). That is, each memristor 100A1 to 100A4 includes two terminals T1 and T2 respectively connected to an N+ drain region 110DA and an N+ source region 100SA, which are formed in a P-substrate 101A and separated by a channel 120A, and each memristor 100A1 to 100A4 includes a floating gate 130A including a poly portion 131A disposed over drain region 110DA and a poly portion 132A disposed over source region 110SA in the manner that generates the asymmetric source/drain-to-gate coupling described above with reference to FIG. 1. Memristors 100A1 to 100A4 are characterized by having asymmetric channel doping patterns 140A1 to 140A4 that are respectively entirely formed by a single N-type or P-type implant. As discussed above, providing a P-type implant adjacent to drain region 110DA increases the adjacent lateral field (i.e., in comparison to an N-type implant or the absence of a P-type channel implant), which functions to increase program operation speeds. Providing an N-type implant adjacent to the source region 110SA decreases the adjacent lateral field (i.e., in comparison to a P-type implant or the absence of an N-type channel implant. Accordingly, the operating characteristics of memristors 100A1 to 100A4 are effectively "tuned" to provide the often-desired operating characteristics of reduced forward threshold voltage and/or to suppress over-erase by forming asymmetric channel doping patterns 140A1 to 140A4 such that each pattern consists essentially of either (i) a single P-type implant disposed adjacent to drain region 110DA, or (ii) a single N-type implant disposed adjacent to source region 110SA. For example, referring to FIG. 3A, asymmetric channel doping pattern 140A1 includes a single P-type implant 141A-1 extending from drain region 110DA into drain-side channel region 121A. Referring to FIG. 3B, asymmetric channel doping pattern 140A2 includes a single N-type implant 142A-1 extending from drain region 110DA into source-side channel region 122A, which provides protection from read disturb at the expense of lower programming speed. Referring to FIG. 3C, asymmetric channel doping pattern 140A3 includes a single P-type implant 141A-2 disposed in drain-side channel region 121A between drain region 110DA and channel midpoint 123A. Referring to FIG. 3D, asymmetric channel doping pattern 140A4 includes a single N-type implant 142A-2 disposed in source-side channel region 122A between source region 110SA and channel midpoint 123A. As illustrated by asymmetric channel doping patterns 140A1 to 140A4, the location of the drain-side and source-side implants may vary to achieve a desired operating characteristic. Note that, in some cases (not shown) the associated P-type or N-type implant may extend over the channel midpoint (i.e., provided the resulting arrangement is asymmetrical). The doping level and/or implant angle of the drain-side and source-side implants can be varied.

According to a practical embodiment, to minimize fabrication costs, the P-type implants and N-type implants utilized in asymmetric channel doping patterns 140A1 to 140A4 are formed using standard CMOS processes (i.e., the P-type and N-type implants are respectively formed simultaneously with P-type and N-type implants utilized by other devices fabricated on substrate 101A). For example, in one embodiment P-type implant 141A-1 of asymmetric channel doping pattern 140A1 (FIG. 3A) is formed using a pocket implant (PI) process, which is a standard implant step existing in standard CMOS process flows capable of fabrication non volatile memory (NVM), and typically includes implanting Boron or $BF_2$ with a dose in the range of 5E13 to 5E14 cm$^{-3}$ at an energy in the range of 40 keV to 80 keV and a tilt angle that can be varied from 0 degrees to 45 degrees or more. Similarly, in one embodiment N-type implant 142A-1 (FIG. 3B) is formed using an N-type lightly doped drain (LDD) implant process, which is also a standard implant step existing in substantially all standard CMOS process flows, and typically includes implanting Phosphorous or Arsenic with a dose in the range of 1E14 to 3E14 cm$^{-2}$ using an energy in the range of 20 keV to 50 keV and a tilt angle of 7 degrees. In other embodiments, one or more non-standard (special) implants generated by way of additional (non-standard/special) implant processes to enhance operating characteristics of a single-channel memristor. For example, in one embodiment P-type implant 141A-2 (FIG. 3C) is formed using a non-standard P-type implant process that differs from the standard CMOS PI implant by way of utilizing a different dopant, a different implant energy, a different implant time, or different tilt or twist parameters, whereby the resulting non-standard P-type implant differs in dopant composition, doping concentration level and/or doping profile from standard PI implants produced by way of corresponding standard PI implant processes. In another embodiment N-type implant 142A-2 (FIG. 3D) is formed using a non-standard N-type implant process that differs from the standard CMOS NLDD implant in a similar manner.

FIGS. 4A, 4B1 and 4B2 show a single-channel memristor 100B according to another exemplary embodiment. FIG. 4A shows memristor 100B from a top view, and FIGS. 4B1 and 4B2 show memristors 100B1 and 100B2, which represent alternative versions of memristor 100B taken along section line 4B-4B in FIG. 4A. Like the previously described embodiments, memristor 100B includes an N+ drain region 110DB and an N+ source region 110SB formed in p-type substrate 101B and an integral polysilicon floating gate structure 130B that extends over channel region 120B, where gate structure 130B and source/drain regions 110DE and 110SE are configured as described above to generate a higher gate-to-drain capacitance than gate-to-source capacitance.

Referring to FIG. 4A, floating gate structure 130B includes an integral c-shaped polycrystalline silicon structure having a first arm 131B-1 and a second arm 131B-2 that are respectively connected at one end to a base 132B. Base 132B is generally disposed over channel region 120B and portions of base 132B extend over corresponding portions of drain region 110DB and source region 110SB. First and second arms 131B-1 and 131B-2 extend in parallel from base 132B over corresponding portions of drain region 110DB to produce the desired higher gate-to-drain capacitance $C_{GD}$. As in the generalized embodiment shown in FIG. 1, floating gate structure 130B is formed on an HV oxide (not shown) and forms the only polycrystalline silicon structure of memristor 100B. The x-box features shown in drain region 110DB and source region 110SB indicate exemplary source/drain contact points (e.g., by way of corresponding metal contact structures 155B shown in FIG. 4B1).

Referring to FIG. 4A, memristor 100B also differs from the examples described above with reference to FIGS. 3A to 3D in that asymmetric channel doping pattern 140B includes both a P-type implant 141B disposed adjacent to drain region 110DB and an N-type implant 142B disposed adjacent to source region 110SB. As indicated in FIGS. 4B1 and 4B2, alternative memristors 100B1 and 100B2 include slightly different asymmetric channel doping patterns 140B1 and 140B2, where P-type implant 141B1 of doping pattern 140B1 (FIG. 4B1) is implemented as a standard CMOS PI that abuts N+ drain region 110DB and extends into channel region 120B, and P-type implant 141B2 of doping pattern 140B2 (FIG. 4B2) is implemented as a CMOS PI that is shifted into channel region 120B (i.e., away from drain region 110DB). In both cases, N-type implant 142B is implemented as a standard CMOS NLDD implant that abuts N+ source region 110SB and extends into channel region 120B. As mentioned above, P-type implant, N-type implant and no-implant represent three implant "grades" that are possible for enhancing the gate-to-drain and gate-to-source lateral fields. As discussed above with reference to FIGS. 3A to 3D, certain desired operating characteristics (e.g., low reverse threshold voltage, fast programming speeds and/or over-erase suppression, and read disturb protection) can be achieved by providing a single drain-side P-type implant or a single source-side N-type implant. As further discussed above with reference to FIGS. 3A and 3C, the operating characteristics generated by a drain-side P-type implant may be varied by way of shifting the P-type implant toward the center of the drain region. As indicated in FIG. 4B2, shifting PI implant 141B2 toward the center of channel region 120B may be achieved by way of implementing an optional dummy poly structure 135B in the region located between arms 131B-1 and 131B-2 of floating gate structure 130B (i.e., as indicated in FIG. 4A using dashed lines to indicate this structure is optional), and then forming P-type implant 141B2 by directing a P-type dopant (e.g., Boron) at a large implant angle θ (i.e., 45° and more) between dummy poly structure 135B and floating gate structure 130B. Note that the presence of dummy poly structure 135B does not influence device operations, and therefore may be retained as part of the final memristor structure. In other embodiments, an extra resist mask may be used in place of dummy poly structure 135B. These desired operating characteristics are further enhanced by way of providing memristor 100B with both P-type drain-side implant 141B (i.e., either implant 141B1 or implant 141B2, shown in FIGS. 4B1 and 4B2, respectively) and N-type source-side implant 142B. That is, by providing both P-type drain-side implant 141B and N-type source-side implant 142B, memristor 100B can exhibit a lower reverse threshold voltage, optimal for the memristor application programming/erase, over-erase and read disturb protection than any of the single implant embodiments described above with reference to FIGS. 3A to 3D.

Figure 5A:
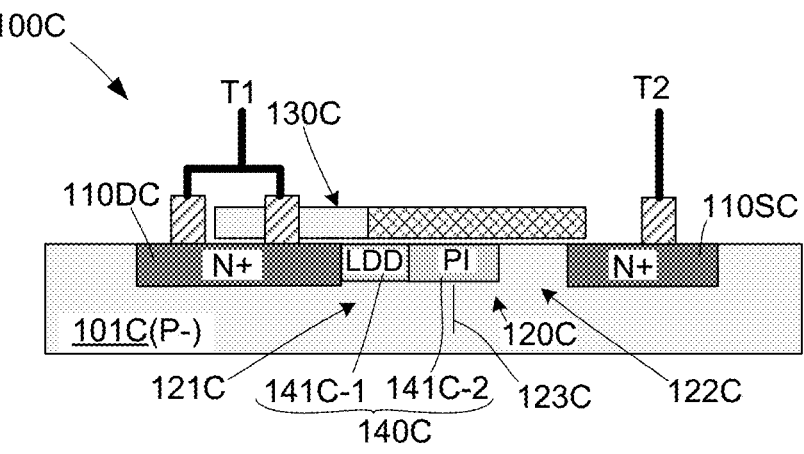
FIGS. 5A and 5B are simplified cross-sectional side view showing memristors including two or more channel implants according to exemplary embodiments.
Figure 5B:
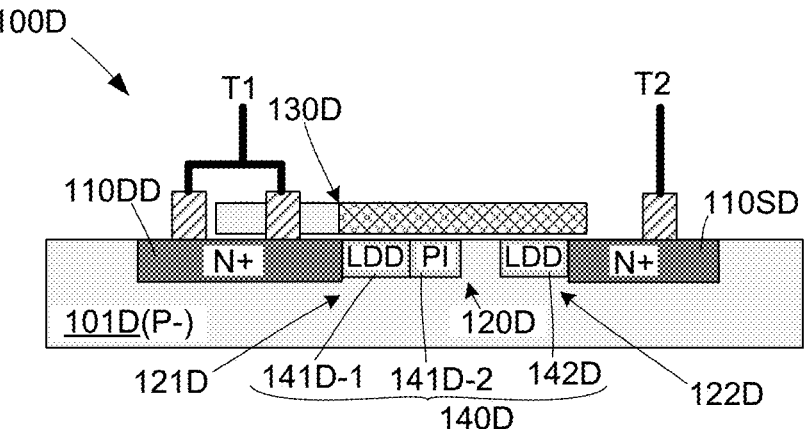

FIGS. 5A and 5B depict additional exemplary memristors 100C and 100D having asymmetric channel doping patterns that include two or more drain-side and/or source-side implants. Like previous embodiments memristors 100C and 100D are respectively formed on p-type substrates 101C and 101D, and respectively include N+ drain regions 110DC and 110DD and N+ source regions 110SC and 110SD separated by channel regions 120C and 120D, and respectively have floating gate structures 130C and 130D configured to generate the asymmetric source/drain-to-gate coupling described above. Memristors 100C and 100D differ from previous embodiments in that they include both drain-side N-type implants 141C-1 and 141D-1 and drain-side P-type implants 141C-2 and 141D-2. In each case, N-type implant 141C-1 and 141D-1 abuts drain regions 110DC and 110DD, and P-type implant 141C-2 and 142D 2 abuts N-type implant 141C-1 and 141C-2. In a practical embodiment, N-type implants 141C-1 and 141D-1 are formed using a standard CMOS NLDD process with a 7-degree tilt angle, and P-type implants 141C-2 and 142D-2 are formed using a standard CMOS PI process with a 45-degree tilt angle. The resulting drain-side implant pattern slightly reduces programming speed (i.e., due to the lower lateral fields generated by the proximity of N-type implants 141C-1 and 141D-1 to drain regions 110DC and 110DD, respectively), but enhances the suppression of over-erase and read disturb. That is, memristors 100C and 100D exhibit reduced read disturb issues while maintaining low read voltages by forming P-type implants 141C-2 and 141D-2 at a large implant angle (i.e., 45° and more, as described above with reference to FIG. 4B2), thus relocating these P-type implants in the direction of channel midpoint 123C, and by forming N-type LDD implants 141C-1 and 141D-1 closer to drain regions 110DC and 110DD by utilizing a lower implant angle (e.g., 0° to 7°). This drain-side implant pattern decreases the lateral field generated near drain regions 110DC and 110DD, where injection of hot electrons into the floating gate takes place, while maintaining a high forward threshold voltage that minimizes the flow of electrons from drain regions 110DC and 110DD in the erase operation and thus suppresses over-erase. Such drain engineering benefits memristors by providing a trade off between programming speed and other operating characteristics and is very different from what is typically used in NVM devices where programming time is critical. Memristor 100D (FIG. 5B) further includes a source-side N-type implant 142D that further suppresses over-erase (i.e., by resisting avalanche) and thus also sneak currents, but also reduces erase speed (i.e., in comparison to memristor 100C, which implements a no-doping source-side doping portion). Note that P-type implant 141C-2 (FIG. 5A) can be symmetrically positioned in channel 120C (i.e., such that a midpoint of implant 141C-2 coincides with channel midpoint 123C) due to the asymmetry provided by N-type implant 141C-1, but P-type implant 141D-2 must be asymmetrically disposed in channel 120D when N-type implants 141D-1 and 142D are symmetrical.

Figure 6:
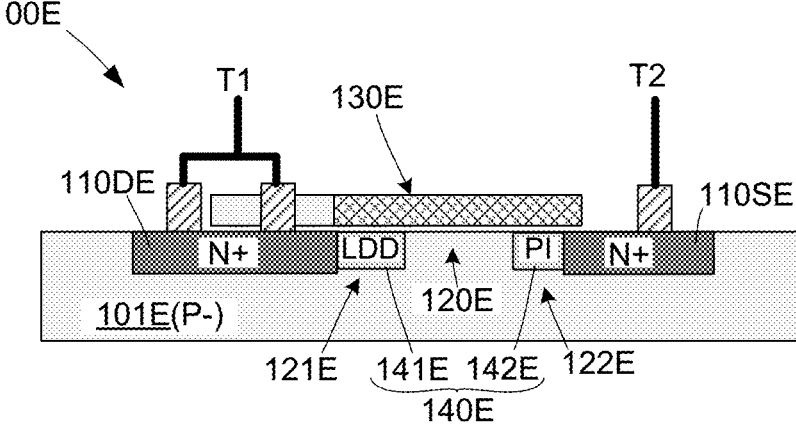
FIG. 6 is a simplified cross-sectional side view showing a memristor according to another exemplary embodiment.

FIG. 6 depicts a memristor 100E including an asymmetric channel doping pattern 140E that facilitates higher erase speeds at the expense of program speed. Like the previously described embodiments, memristor 100E includes an N+ drain region 110DE and an N+ source region 110SE formed in p-type substrate 101E and an integral (e.g., C-shaped) polysilicon floating gate structure 130E that extends over channel region 120E, where gate structure 130E and source/drain regions 110DE and 110SE are configured as described above to generate a higher gate-to-drain capacitance than gate-to-source capacitance. Similar to doping pattern 140B of memristor 100B (FIG. 4B), asymmetric channel doping pattern 140E includes a drain-side implant 141E that differs from source-side implant 142E (i.e., such that the doping patterns formed in drain-side region 121E and source-side region 122 are asymmetrical). However, asymmetric channel doping pattern 140E differs from doping pattern 140B (FIG. 4B) in that drain-side implant 141E comprises an N-type implant (e.g., a standard CMOS NLDD implant or an N-type threshold voltage implant) and source-side implant 142E comprises a P-type implant (e.g., a pocket implant (PI)). As explained above, P-type implant 142E generates a relatively strong lateral field in the vicinity of source region 110SE and N-type implant 141E generates a relatively weak lateral field in the vicinity of drain region 110DE. As such, asymmetric channel doping pattern 140E produces faster erase operations than that of doping pattern 140B (FIG. 4B) because the erase operation uses the stronger lateral field above source region 110SE to heat the holes generated by band-to-band tunneling. However, i.e., in comparison to doping pattern 140B (FIG. 4B), asymmetric channel doping pattern 140E also produces slower program operations (but suppressed read disturb) because the weak lateral field generated by N-type implant 141E produces less electron heating during programming, and P-type implant 142E causes a higher lateral field heating BBT holes during erase. Nonetheless, the inventors believe memristor 100E may prove valuable in certain applications (e.g., when a neuromorphic circuit requires memristors exhibiting high erase speeds) and the negative consequences connected with low programming speed are tolerable. In some instances the negative consequences connected with PI implant near source may be moderated (e.g., by omitting N-type implant 141E, and/or by modifying each memristor to include a drain-side diode, for example, as described below with reference to FIGS. 7A, 7B and 8.

Figure 7A:
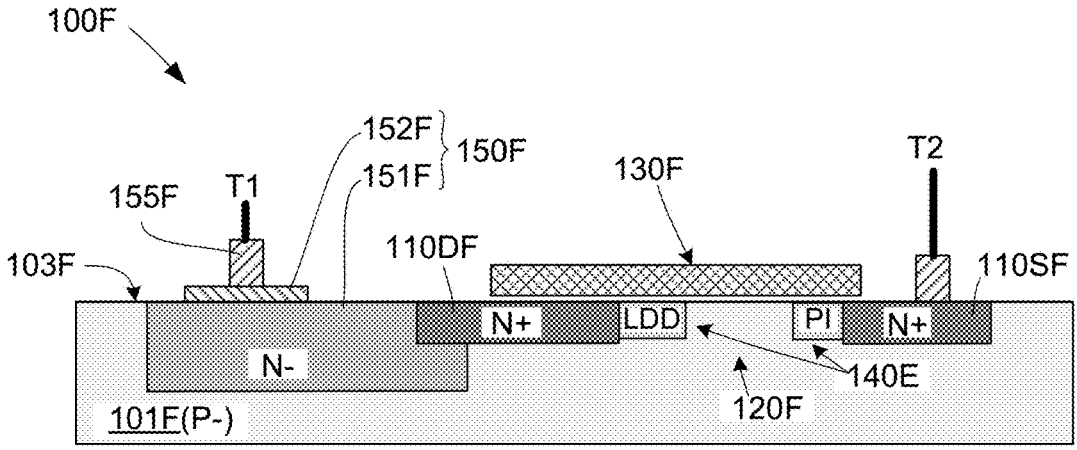
FIGS. 7A and 7B are simplified cross-sectional side view showing memristors including Schottky diodes according to exemplary embodiments.
Figure 7B:
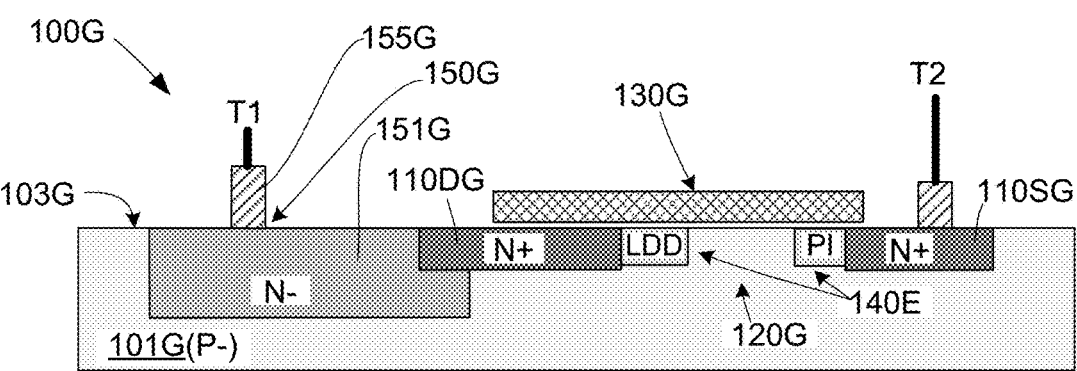
Figure 8:
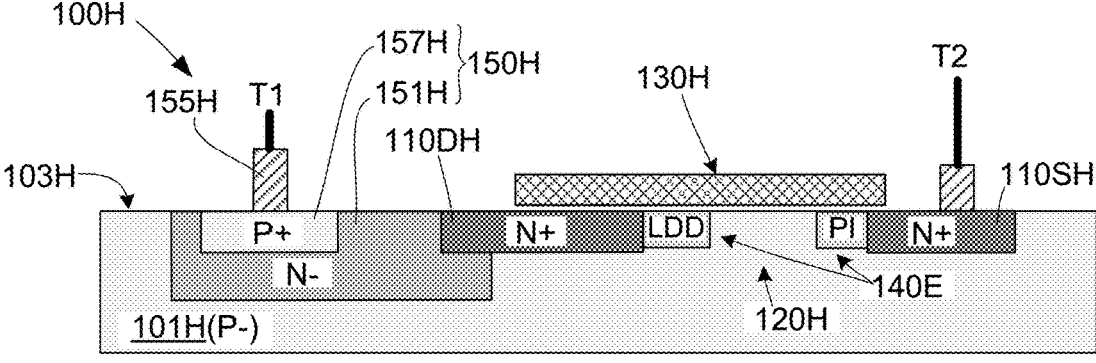
FIG. 8 is a simplified cross-sectional side view showing a memristor including a p-n junction diode according to another exemplary embodiment.

FIGS. 7A, 7B and 8 depict various exemplary single-channel memristors including a drain-side diode that is configured and oriented to allow electron flow in the forward direction (i.e., from the source region to the drain region) and to impede electron flow in the reverse (opposite) direction (i.e., from the drain region to the source region). As set forth below, each of the depicted exemplary drain-side diodes is at least partially disposed in an N-well region that is formed in a bulk substrate and abuts the N+ drain region and is implemented either as a Schottky diode or a vertical p-n junction diode. By preventing current flow in the reverse direction (i.e., from terminal T2 to terminal T1), each of the exemplary diodes serves to prevent over-erase of the floating gate during high-voltage erase operations and also serves to prevent sneak (leakage) currents during low-voltage readout operations.

FIG. 7A depicts a memristor 100F including a first Schottky diode 150F. Like the previously described embodiments, memristor 100F includes N+ source/drain regions 110DF and 110SF formed in p-type substrate 101F and an integral (e.g., C-shaped) polysilicon floating gate structure 130F that generates a higher gate-to-drain capacitance than gate-to-source capacitance. Memristor 100F also includes asymmetric channel doping pattern 140E in channel region 120F, where asymmetric channel doping pattern 140E is formed as described above with reference to FIG. 6. Schottky diode 150F is formed by a salicide structure 152F disposed between metal contact structure 157F and a portion of upper substrate surface 103F over N-well region 151F (i.e., the salicide-to-silicon interface between salicide structure 152F and N-well region 151F forms the Schottky diode structure). Schottky diode 140C may require some tuning of the salicide formation process to obtain a high-quality diode.

FIG. 7B shows a memristor 100G including a second Schottky diode 150G according to another specific embodiment of the present invention. Similar to memristor 100E, memristor 100G memristor 100G includes an N+ drain region 110DG and an N+ source region 110SG that are respectively coupled to terminals T1 and T2 and are separated by a channel 120G, a floating gate 130G and exemplary asymmetric channel doping pattern 140E. In this embodiment, an N− implant region 151G that is formed in substrate 101G such that it abuts N+ drain region 110DG, and Schottky diode 150G is implemented by direct contact between a metal interconnect structure 155G and a portion of upper surface 103G of substrate 101G over N− implant region 151G.

FIG. 8 shows a memristor 100H including a p-n junction diode 150H according to another specific embodiment of the present invention. Similar to previous embodiments, memristor 100H includes an N+ drain region 110DH and an N+ source region 110SH that are respectively coupled to terminals T1 and T2 and are separated by a channel 120H, a floating gate 130H and exemplary asymmetric channel doping pattern 140E. In this embodiment, P/N diode 150H includes an N− implant region 151H that is formed in substrate 101H such that it abuts N+ drain region 110DH, and a P+ implant 157H that is formed in N− region 151H and is connected to terminal T1 (e.g., by way of a metal structure 155H that contacts upper surface 103H of substrate 101H over P+ implant 157H). In one embodiment, P+ diffusion region 157H (the diode's anode) is formed in N-well region 151H (cathode) using established (standard) N− and P+ implants provided in the single-poly CMOS fabrication flow to minimize fabrication costs. In other embodiments, at least one of these implants may be implemented by a non-standard (special) implant that is optimized to enhance diode performance (e.g., P+ diffusion region 157H is a non-standard implant and N-well region 151H is a standard implant, or P+ diffusion region 157H is a standard implant and N-well region 151H is a non-standard implant, or both P+ diffusion region 157H and N-well region 151H are non-standard implants).

In some embodiments the use of Schottky diodes (e.g., diodes 150F and 150G, described above with reference to FIGS. 7A and 7b) may provide certain advantages over p-n junction diodes (e.g., diode 160H shown in FIG. 8). That is, referring to FIG. 8, a parasitic transistor may be formed by P+ region 157H, N-well region 151H and P− (bulk) substrate 101H that may be switched on during programming and readout by potentials generated at drain region 100DH. The Schottky approach of memristors 100F and 100G (FIGS. 7A and 7B) eliminate this possible parasitic transistor by eliminating all P-N-P structures in the diode region.

Figure 9:
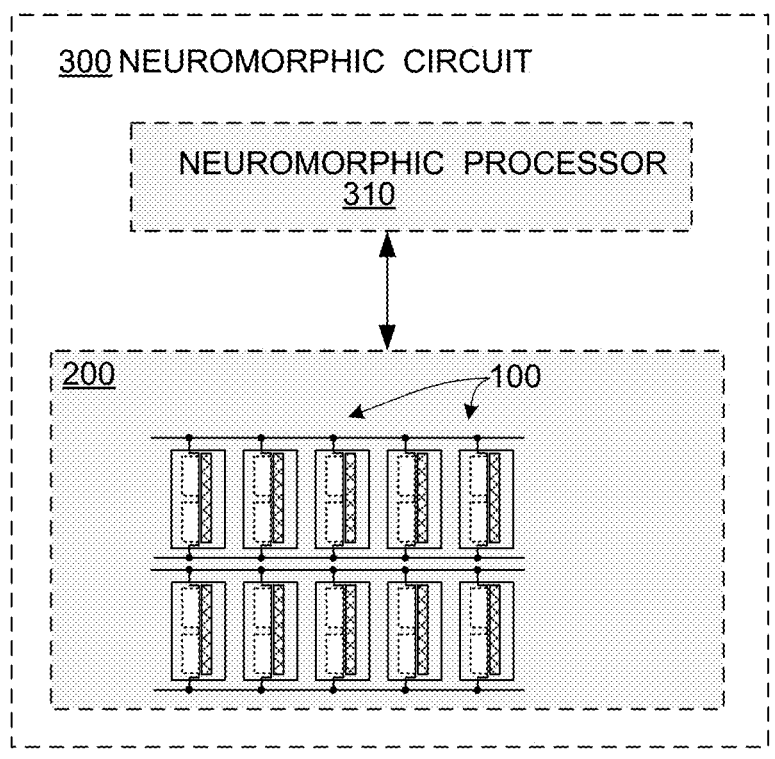
FIG. 9 is a simplified circuit diagram showing a neuromorphic circuit including the memory circuit of FIG. 1 according to another exemplary embodiment of the present invention.

FIG. 9 is a block diagram depicting a neuromorphic circuit 300 including memory circuit 200 having memristors 100 formed in accordance with any of the various embodiments described above. As set forth above, memristor 100 can be configured in a way that avoids over-erase and sneak current effects while facilitating low voltage readout operations, making memristors 100 suitable for cross-point arrays, which is ideal for most neuromorphic circuits and other bio-inspired devices that emulate learning functions. Further, because memristors 100 have a smaller footprint in comparison to conventional memristors (e.g., due to their single-channel configuration), the chip area occupied by memory circuit 200 is substantially smaller than that of a comparable memory circuit comprising conventional memristors, thereby facilitating the production of neuromorphic circuit 300 at a lower cost. Moreover, the single-poly structure of memristor 100 facilitates integration of memory circuit 200 into the same standard single-poly CMOS fabrication flow utilized to generate other circuitry (e.g., a neuromorphic processor 310) of neuromorphic circuit 300, thereby further reducing production costs. Memristors 100 produced in the manner above are also believed to be highly reproducible and repeatable, to exhibit extra high retention, and to require relatively simple circuitry for performing the program, erase and readout operations described above.

Although the present invention has been described with respect to certain specific embodiments, it will be clear to those skilled in the art that the inventive features of the present invention are applicable to other embodiments as well, all of which are intended to fall within the scope of the present invention. For example, although the invention is described with reference to N-channel memristors, those skilled in the art will understand that the invention may also be used to generate P-channel memristors (e.g., including P+ source and drain regions separated by an N-channel region, with the NLDD and PI implants being reversed from those described above). In addition, although the memristors of the present invention are described with reference to bulk silicon single-poly CMOS fabrication flows, they may also be produced using SOI CMOS fabrication flows and/or more complicated multiple-poly fabrication flows (e.g., when other portions of a neuromorphic circuit implementing the memristors include circuit elements that require the use of a multiple-poly fabrication flow).

The invention claimed is:

1. A two-terminal memristor comprising:
a substrate having an upper surface and including a drain region and a source region separated by a channel region;
a gate oxide layer disposed on the upper surface;
a single-piece, integral floating polycrystalline silicon structure disposed on the gate oxide layer and including a first poly portion disposed over the drain region, a second poly portion disposed over the source region and a third poly portion connected between the first and second poly portions and extending over the channel region; and
an asymmetric channel doping pattern including at least two implants asymmetrically disposed in the channel region between the drain region and the source region,
wherein the single-piece, integral floating polycrystalline silicon structure, the drain region and the source region are configured to generate asymmetric source/drain-to-gate coupling such that a gate-to-drain capacitance generated between the first poly portion and the drain region is greater than a gate-to-source capacitance generated between the second poly portion and the source region, and
wherein said at least two implants comprises at least one N-type dopant implant and at least one P-type dopant implant.

2. The two-terminal memristor of claim 1, wherein said asymmetric channel doping pattern comprises at least one of (i) a single P-type implant disposed adjacent to the drain region and (ii) a single N-type implant disposed adjacent to the source region.

3. The two-terminal memristor of claim 1, wherein said single-piece, integral floating polycrystalline silicon gate structure comprises the only polycrystalline silicon structure of said two-terminal memristor.

4. The two-terminal memristor of claim 3, wherein said single-piece, integral floating polycrystalline silicon gate structure comprises a c-shaped polycrystalline silicon structure including first and second arms extending in parallel from a base, wherein the first and second arms extend over the drain region and a portion of the base extends over the source region.

5. The two-terminal memristor of claim 1, wherein said at least two implants forming the asymmetric channel doping pattern comprises both an N-type implant and a P-type implant.

6. The two-terminal memristor of claim 5, wherein the P-type implant is disposed adjacent to the drain region and the N-type implant is disposed adjacent to the source region.

7. The two-terminal memristor of claim 5, wherein the N-type implant abuts the drain region and the P-type implant abuts the N-type implant.

8. The two-terminal memristor of claim 7, further comprising a second N-type implant abutting the source region.

9. The two-terminal memristor of claim 5, wherein the N-type implant is disposed adjacent to the drain region and the P-type implant is disposed adjacent to the source region.

10. The two-terminal memristor of claim 1, wherein both the drain region and the source comprise N+ doped regions disposed in a p-type silicon substrate, and wherein the two-terminal memristor further comprises a diode is at least partially disposed in an N-well region that is formed in the p-type silicon substrate, said N-well region abutting the N+ drain region.

11. The two-terminal memristor of claim 10, wherein the diode comprises a Schottky diode including a silicide structure disposed in contact with said N-well region by way of an upper surface of said p-type silicon substrate.

12. The two-terminal memristor of claim 10, wherein the diode comprises a Schottky diode including a junction formed between a metal contact structure disposed in contact with said N-well region by way of an upper surface of said p-type silicon substrate.

13. The two-terminal memristor of claim 11, wherein the diode comprises a P+ diffusion region disposed in the N-well region and connected to a first terminal of the two-terminal memristor.

14. A memory circuit comprising a plurality of two-terminal memristors fabricated on a semiconductor substrate and disposed in a cross-point array, each said memristor having a first terminal connected to an associated first line and a second terminal connected to an associated second line, wherein said each memristor comprises:

a drain region and a source region formed in the substrate and separated by a channel region;

a single-piece, integral floating polycrystalline silicon structure including a first poly portion disposed over the drain region, a second poly portion disposed over the source region and a third poly portion connected between the first and second poly portions and extending over the channel region; and an asymmetric channel doping pattern including at least two implants asymmetrically disposed in the channel region between the drain region and the source region, wherein the single-piece, integral floating polycrystalline silicon structure, the drain region and the source region are configured to generate asymmetric source/drain-to-gate coupling such that a gate-to-drain capacitance generated between the first poly portion and the drain region is greater than a gate-to-source capacitance generated between the second poly portion and the source region, and wherein said at least two implants comprises at least one N-type dopant implant and at least one P-type dopant implant.

15. The memory circuit according to claim 14, further comprising a control circuit configured to apply a positive programming voltage to the associated first line of said each memristor while coupling the associated second line to ground during a program operation period, thereby generating a channel hot electron (CHE) injection mechanism that causes the injection of electrons into said single-piece, integral floating polycrystalline silicon gate structure by way of said second poly portion, whereby the resulting programmed charge stored on said single-piece, integral floating polycrystalline silicon gate structure increases the threshold voltage of said each memristor.

16. The memory circuit according to claim 14, further comprising a control circuit configured to apply a positive erase voltage to the associated second line of said each memristor while coupling the associated first line to ground during an erase operation period, thereby generating a band-to-band tunneling mechanism that causes the injection of holes into said single-piece, integral floating polycrystalline silicon gate structure by way of said second poly portion), whereby an erased charge stored on said single-piece, integral floating polycrystalline silicon gate structure decreases the threshold voltage of said each memristor.

17. The memory circuit according to claim 14, further comprising a control circuit configured to apply a first positive readout voltage to the associated first line of said each memristor and to apply a second positive readout voltage to the associated second line, said first readout voltage being higher than said second readout voltage, said control circuit also being configured to measure the resulting read current passed through said each memristor onto the associated second line during a readout operation period.

18. A neuromorphic circuit comprising a plurality of two-terminal memristors fabricated on a semiconductor substrate, each said memristor comprising:

a drain region and a source region formed in the substrate and separated by a channel region;

a single-piece, integral floating polycrystalline silicon structure including a first poly portion disposed over the drain region, a second poly portion disposed over the source region and a third poly portion connected between the first and second poly portions and extending over the channel region; and an asymmetric channel doping pattern including at least two implants asymmetrically disposed in the channel region between the drain region and the source region, wherein the single-piece, integral floating polycrystalline silicon structure, the drain region and the source region are configured to generate asymmetric source/drain-to-gate coupling such that a gate-to-drain capacitance generated between the first poly portion and the drain region is greater than a gate-to-source capacitance generated between the second poly portion and the source region, and wherein said at least two implants comprises at least one N-type dopant implant and at least one P-type dopant implant.

19. The neuromorphic circuit of claim 18, further comprising a control circuit configured to:

apply a positive programming voltage to the first terminal of said each memristor while coupling the second terminal of said each memristor to ground during a program operation period such that electrons are injected into said single-piece, integral floating polycrystalline silicon gate structure, and apply a positive erase voltage to the associated second terminal of said each memristor while coupling the first terminal of said each memristor to ground during an erase operation period such that holes are injected into said single-piece, integral floating polycrystalline silicon gate structure.

* * * * *